US008120382B2

(12) United States Patent
Bauer et al.

(10) Patent No.: US 8,120,382 B2
(45) Date of Patent: Feb. 21, 2012

(54) PROGRAMMABLE INTEGRATED CIRCUIT WITH MIRRORED INTERCONNECT STRUCTURE

(75) Inventors: Trevor J. Bauer, Boulder, CO (US); Ramakrishna K. Tanikella, Hyderabad (IN); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/718,848

(22) Filed: Mar. 5, 2010

(65) Prior Publication Data

US 2011/0215834 A1    Sep. 8, 2011

(51) Int. Cl.
*H03K 19/177* (2006.01)
(52) U.S. Cl. ............................. 326/41; 326/38; 326/40
(58) Field of Classification Search ............... 326/38–47
See application file for complete search history.

(56) References Cited

U.S. PATENT DOCUMENTS

| 5,448,493 | A | * | 9/1995 | Topolewski et al. | 716/117 |
|---|---|---|---|---|---|
| 5,570,040 | A | * | 10/1996 | Lytle et al. | 326/41 |
| 5,815,004 | A | * | 9/1998 | Trimberger et al. | 326/41 |
| 5,880,598 | A | * | 3/1999 | Duong | 326/41 |
| 5,894,565 | A | * | 4/1999 | Furtek et al. | 326/38 |
| 6,130,550 | A | * | 10/2000 | Zaliznyak et al. | 326/39 |
| 6,696,855 | B1 | * | 2/2004 | Kapusta et al. | 326/39 |
| 6,809,549 | B2 | * | 10/2004 | Baxter | 326/39 |
| 7,327,159 | B1 | * | 2/2008 | Agrawal et al. | 326/38 |
| 2004/0150422 | A1 | | 8/2004 | Wong | |
| 2005/0242866 | A1 | | 11/2005 | Vadi et al. | |

* cited by examiner

*Primary Examiner* — Shawki S Ismail
*Assistant Examiner* — Crystal L Hammond
(74) *Attorney, Agent, or Firm* — LeRoy D. Maunu

(57) ABSTRACT

A programmable integrated circuit (IC) with mirrored interconnect structure. The IC includes a plurality of arrangements, which are horizontally arranged. Each arrangement includes a first logic column, an interconnect column, and a second logic column. Each interconnect column includes programmable interconnect blocks (148), and each of the first and second logic columns includes programmable logic blocks. Each programmable interconnect block provides a plurality of first input and output ports on a first side and a plurality of second input and output ports on a second side. The first ports and the first side of each of the programmable interconnect blocks physically mirror the second ports and the second side of the programmable interconnect block. The ports of the programmable interconnect blocks are coupled to the ports of the programmable logic blocks in the first and second logic columns.

20 Claims, 3 Drawing Sheets

PROGRAMMABLE INTEGRATED CIRCUIT WITH MIRRORED INTERCONNECT STRUCTURE

FIELD OF THE INVENTION

The present invention generally relates to integrated circuits, and more particularly to programmable integrated circuits.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

There is a general need to improve programmable integrated circuits to increase the types of user designs that can be implemented in the programmable integrated circuits.

The present invention may address one or more of the above issues.

SUMMARY

The various embodiments of the invention provide a programmable integrated circuit (IC) with mirrored interconnect structure. The programmable IC includes a plurality of arrangements that are horizontally arranged in the programmable IC. Each arrangement includes a first logic column, an interconnect column, and a second logic column horizontally arranged in that order within the arrangement. Each interconnect column includes a plurality of programmable interconnect blocks vertically arranged in the interconnect column. Each of the first and second logic columns includes a plurality of programmable logic blocks vertically arranged in the logic column.

Each of the programmable interconnect blocks provides a plurality of first input and output ports at a first side of the programmable interconnect block and a plurality of second input and output ports at a second side of the programmable interconnect block. Each of the programmable logic blocks provides a plurality of third input and output ports. The first ports and the first side of each of the programmable interconnect blocks physically mirror the second ports and the second side of the programmable interconnect block. The first ports of the programmable interconnect blocks in the interconnect column of each arrangement are coupled to the third ports of the programmable logic blocks in the first logic column of the arrangement, and the second ports of the programmable interconnect blocks in the interconnect column of each arrangement are coupled to the third ports of the programmable logic blocks in the second logic column of the arrangement.

In another embodiment, a programmable IC includes a plurality of arrangements horizontally arranged in the programmable IC. Each arrangement including a first logic column, a first interconnect column, a second interconnect column, and a second logic column horizontally arranged in that order within the arrangement. Each of the first and second interconnect columns includes a plurality of programmable interconnect blocks vertically arranged in the interconnect column. Each of the first and second logic columns includes a plurality of programmable logic blocks vertically arranged in the logic column.

Each of the programmable interconnect blocks provides a plurality of first input and output ports at one side of the programmable interconnect block. Each of the programmable logic blocks provides a plurality of second input and output ports at one side of the programmable logic block. The first ports and the one side of each of the programmable interconnect blocks in the first interconnect column of each arrangement physically mirror the first ports and the one side of each programmable interconnect block in the second interconnect column of the arrangement. The first ports of the programmable interconnect blocks in the first interconnect column of each arrangement are coupled to the second ports of the programmable logic blocks in the first logic column of the arrangement. The first ports of the programmable interconnect blocks in the second interconnect column of each arrangement are coupled to the second ports of the programmable logic blocks in the second logic column of the arrangement.

A programmable IC in another embodiment includes a plurality of programmable interconnect blocks vertically arranged in each of a plurality of first interconnect columns and each of a plurality of second interconnect columns. Each of the programmable interconnect blocks provides a plurality of first input and output ports at one of four sides of the programmable interconnect block. A plurality of programmable logic blocks are vertically arranged in each of a plurality of first logic columns and each of a plurality of second logic columns. Each of the programmable logic blocks provides a plurality of second input and output ports at one of four sides of the programmable logic block. The first and second logic columns and the first and second interconnect columns are horizontally arranged in a plurality of arrangements of the programmable IC. Each arrangement includes one of the first logic columns. One of the first interconnect columns, one of the second interconnect columns, and one of the second logic columns are horizontally arranged in that order within the arrangement. The first ports and the one side of each of the programmable interconnect blocks in the first interconnect column of each arrangement physically mirror the first ports and the one side of each of programmable interconnect blocks in the second interconnect column of the arrangement. The first ports of the programmable interconnect blocks in the first interconnect column of each arrangement are coupled to the second ports of the programmable logic blocks in the first logic column of the arrangement. The first ports of the programmable interconnect blocks in the second interconnect column of each arrangement are coupled to the second ports of the programmable logic blocks in the second logic column of the arrangement. Each one of the programmable interconnect blocks in the interconnect columns of the arrangements is coupled to at least four of the programmable interconnect blocks for selectively coupling the second input ports of the programmable logic blocks in the logic columns to the second output ports of the programmable logic blocks via the first output ports of the one of the programmable interconnect blocks and via the first input ports of the at least four of the programmable interconnect blocks.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
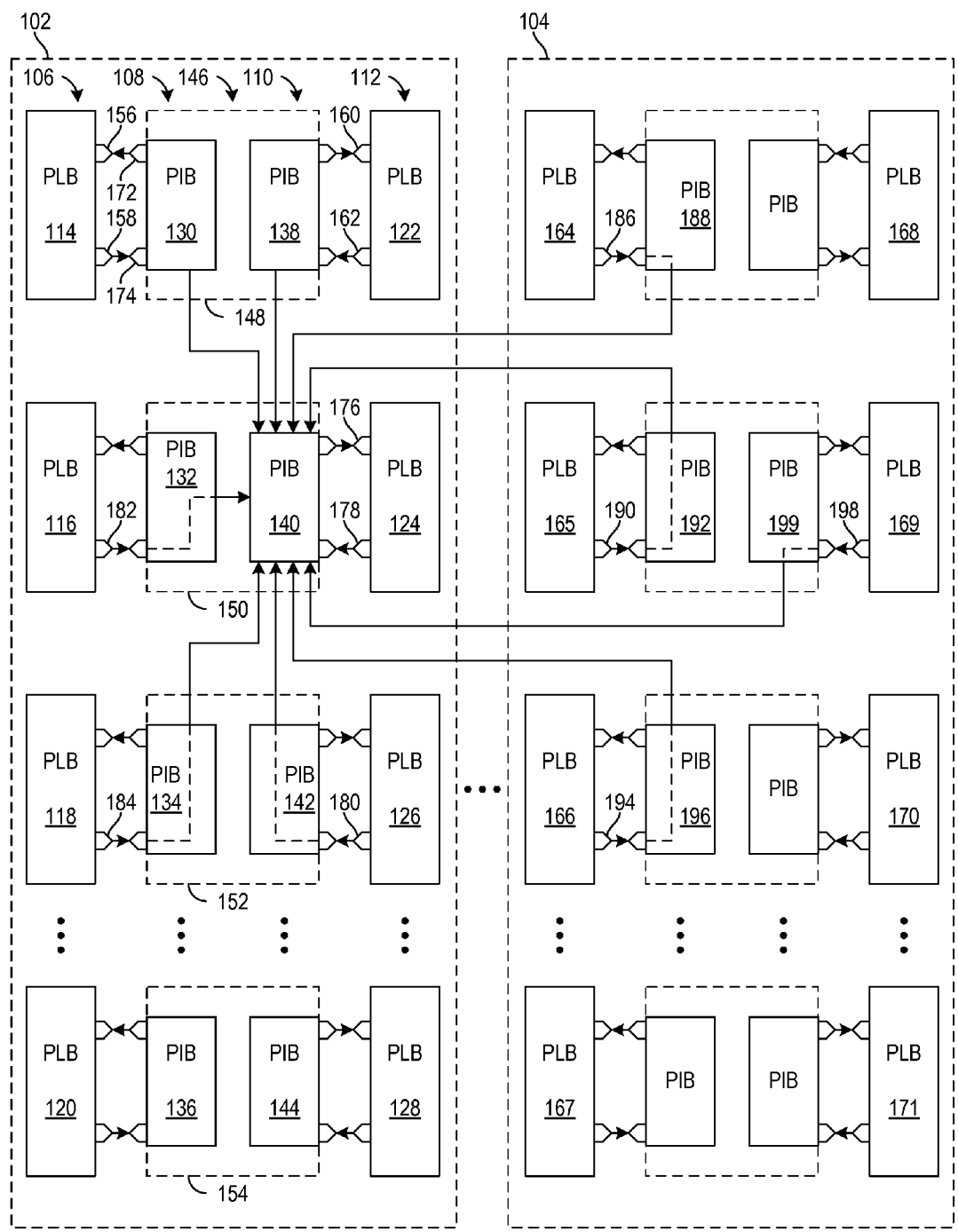
FIG. 1 is a block diagram of a programmable logic device in accordance with various embodiments of the invention.

FIG. 1 is a block diagram of a programmable logic device in accordance with various embodiments of the invention. The programmable logic device includes arrangements 102 through 104 that include programmable logic and interconnect resources. The arrangements 102 through 104 are arranged horizontally in the programmable logic device. It will be appreciated that a simple rotation of the programmable logic device makes the arrangements 102 through 104 vertically arranged.

In one embodiment, arrangement 102 includes four columns 106, 108, 110, and 112 of programmable logic and interconnect blocks. The four columns 106, 108, 110, and 112 are horizontally arranged in that order from left to right within the arrangement 102. The logic columns 106 and 112 include programmable logic blocks 114, 116, and 118 through 120, and 122, 124, and 126 through 128. The programmable logic blocks 114, 116, and 118 through 120 are arranged vertically in logic column 106 and the programmable logic blocks 122, 124, 126 through 128 are arranged vertically in logic column 112. The interconnect columns 108 and 110 include programmable interconnect blocks 130, 132, and 134 through 136, and 138, 140, and 142 through 144. The programmable interconnect blocks 130, 132, and 134 through 136 are arranged vertically in interconnect column 108 and the programmable interconnect blocks 138, 140, and 142 through 144 are arranged vertically in interconnect column 110.

In another embodiment, arrangement 102 includes three columns 106, 146, and 112 of programmable logic and interconnect blocks. The three columns 106, 146, and 112 are horizontally arranged in that order from left to right within arrangement 102. The interconnect column 146 includes a vertical arrangement of programmable interconnect blocks 148, 150, and 152 through 154. Programmable interconnect block 148 includes the two sub-blocks of programmable interconnect blocks 130 and 138, which are horizontally arranged in that order from left to right within programmable interconnect block 148. Similarly, programmable interconnect block 150 includes blocks 132 and 140, programmable interconnect block 152 includes blocks 134 and 142, and programmable interconnect block 154 includes blocks 136 and 144.

In one embodiment, the programmable logic blocks 114, 116, and 118 through 120 in logic column 106 are the same type as the programmable logic blocks 122, 124, and 126 through 128 in logic column 112, and each of the programmable logic blocks 122, 124, and 126 through 128 in logic column 112 is a physical mirror image of each of the programmable logic blocks 114, 116, and 118 through 120 in logic column 106. In this embodiment, the programmable interconnect blocks 130, 132, and 134 through 136 each functionally mirror, but often do not fully physically mirror, the programmable interconnect blocks 138, 140, and 142 through 144.

In another embodiment, the programmable logic blocks 114, 116, and 118 through 120 in logic column 106 are of one type and the programmable logic blocks 122, 124, and 126 through 128 in logic column 112 are of another type. In this embodiment, the ports 156 and 158 along the right side of programmable logic block 114 physically mirror the ports 160 and 162 along the left side of programmable logic block 122, but the programmable logic blocks 114 and 122 do not physically mirror each other because these blocks 114 and 122 are of different types. Similarly, the right side of each of the programmable logic blocks 114, 116, and 118 through 120 in logic column 106 physically mirrors the left side of each of the programmable logic blocks 122, 124, and 126 through 128 in logic column 112.

It will be appreciated that some of the arrangements 102 through 104 could include programmable logic blocks that are all of the same type while others of the arrangements 102 through 104 could include programmable logic blocks of multiple types. In one example, the programmable logic blocks 114, 116, 118 through 120 and 122, 124, and 126 through 128 in arrangement 102 are all of the same type, but in arrangement 104 the programmable logic blocks 164, 165, and 166 through 167 are of a type different from the programmable logic blocks 168, 169, and 170 through 171.

In certain embodiments, each programmable logic block is connected to a corresponding programmable interconnect block. For example, the input ports 156 of programmable logic block 114 are connected to the output ports 172 of programmable interconnect block 130, and the output ports 158 of programmable logic block 114 are connected to the input ports 174 of programmable interconnect block 130.

The input ports of each programmable logic block are coupled to the output ports of many programmable logic blocks via certain ones of the programmable interconnect blocks. For example, the input ports 176 of programmable logic block 124 are coupled to the output ports 178 of programmable logic block 124 via programmable interconnect block 140, the input ports 176 are coupled to the output ports 162 of programmable logic block 122 via programmable interconnect blocks 140 and 138, the input ports 176 are coupled to the output ports 180 of programmable logic block 126 via programmable interconnect blocks 140 and 142, the input ports 176 are coupled to the output ports 158 of programmable logic block 114 via programmable interconnect blocks 140 and 130, the input ports 176 are coupled to the output ports 182 of programmable logic block 116 via programmable interconnect blocks 140 and 132, the input ports 176 are coupled to the output ports 184 of programmable logic block 118 via programmable interconnect blocks 140 and 134, the input ports 176 are coupled to the output ports 186 of programmable logic block 164 via programmable interconnect blocks 140 and 188, the input ports 176 are coupled to the output ports 190 of programmable logic block 165 via programmable interconnect blocks 140 and 192, the input ports 176 are coupled to the output ports 194 of programmable logic block 166 via programmable interconnect blocks 140 and 196, and the input ports 176 are coupled to the output ports 198 of programmable logic block 169 via programmable interconnect blocks 140 and 199. In summary, certain ones of the programmable interconnect blocks couple the input ports 176 of programmable logic block 124 to the output ports of programmable logic blocks 124, 122, 126, 114, 116, 118, 164, 165, 166, and 169. The programmable interconnect blocks similarly couple the input ports of the other programmable logic blocks to the output ports of many others of the programmable logic blocks.

Thus, each programmable interconnect block is connected to many programmable interconnect blocks to permit the input ports of each programmable logic blocks to be connected to the output ports of many other programmable logic blocks. For example, programmable interconnect block 140 is connected to programmable interconnect blocks 138, 142, 130, 132, 134, 188, 192, 196, and 199 to permit the input ports 176 of programmable logic block 124 to be connect to the output ports of programmable logic blocks 122, 126, 114, 116, 118, 164, 165, 166, and 169.

In the illustrated array of programmable logic blocks 114, 116, 118, 120, 122, 124, 126, 128, 164, 165, 166, 167, 168, 169, 170, and 171, and assuming arrangements 102 and 104 are adjacent in the programmable logic device, the vertically, horizontally, and diagonally proximate programmable logic blocks to example programmable logic block 124 are programmable logic blocks 122, 126, 116, 165, 114, 118, 164, and 166. In the illustrated embodiment, the programmable interconnect blocks couple the example programmable logic block 124 to all these proximate programmable logic blocks 122, 126, 116, 165, 114, 118, 164, and 166. The connections coupling each programmable logic block to the vertically, horizontally, and diagonally proximate programmable logic blocks are denoted single connections. The programmable interconnect blocks also couple the example programmable logic block 124 to programmable logic block 169. Connections, such as the connection between example programmable logic block 124 and the remote programmable logic block 169, are denoted long connections. It will be appreciated that long connections can have a variety of lengths.

The performance of programmable logic devices is increasingly determined by the wiring delays of the programmable logic devices. Because single connections are generally shorter than long connections, single connections have lower wiring delays than long connections. To increase the performance of a logic design implemented in the programmable logic device, the implemented logic design should utilize predominately single connections for the critical timing paths of the logic design.

Various embodiments of the invention provide a programmable logic device that shortens the length and reduces the wiring delay of some of the single connections, and consequently improves the performance of a logic design implemented in the programmable logic device. Performance of an implemented logic design is dramatically improved when the shortened-length single connections are preferentially utilized to implement the critical timing paths of the logic design.

Disposing the programmable interconnection column 146 between the programmable logic columns 106 and 112 shortens the length of the single connections between example programmable logic block 124 and programmable logic blocks 114, 116, and 118. This is because the connections between the input port 176 of example programmable logic block 124 and the output ports 158, 182, and 184 of respective programmable logic blocks 114, 116, and 118 remain within the area of the programmable interconnection column 146 and never enter the area of the programmable logic columns 106 and 112. Corresponding single connections with the output ports 178 of example programmable logic block 124 are similarly shortened. The single connections between example programmable logic block 124 and programmable logic blocks 114, 116, and 118 directly couple these programmable logic blocks without incurring any wiring delay from crossing the programmable logic columns 106 and 112.

Figure 2:
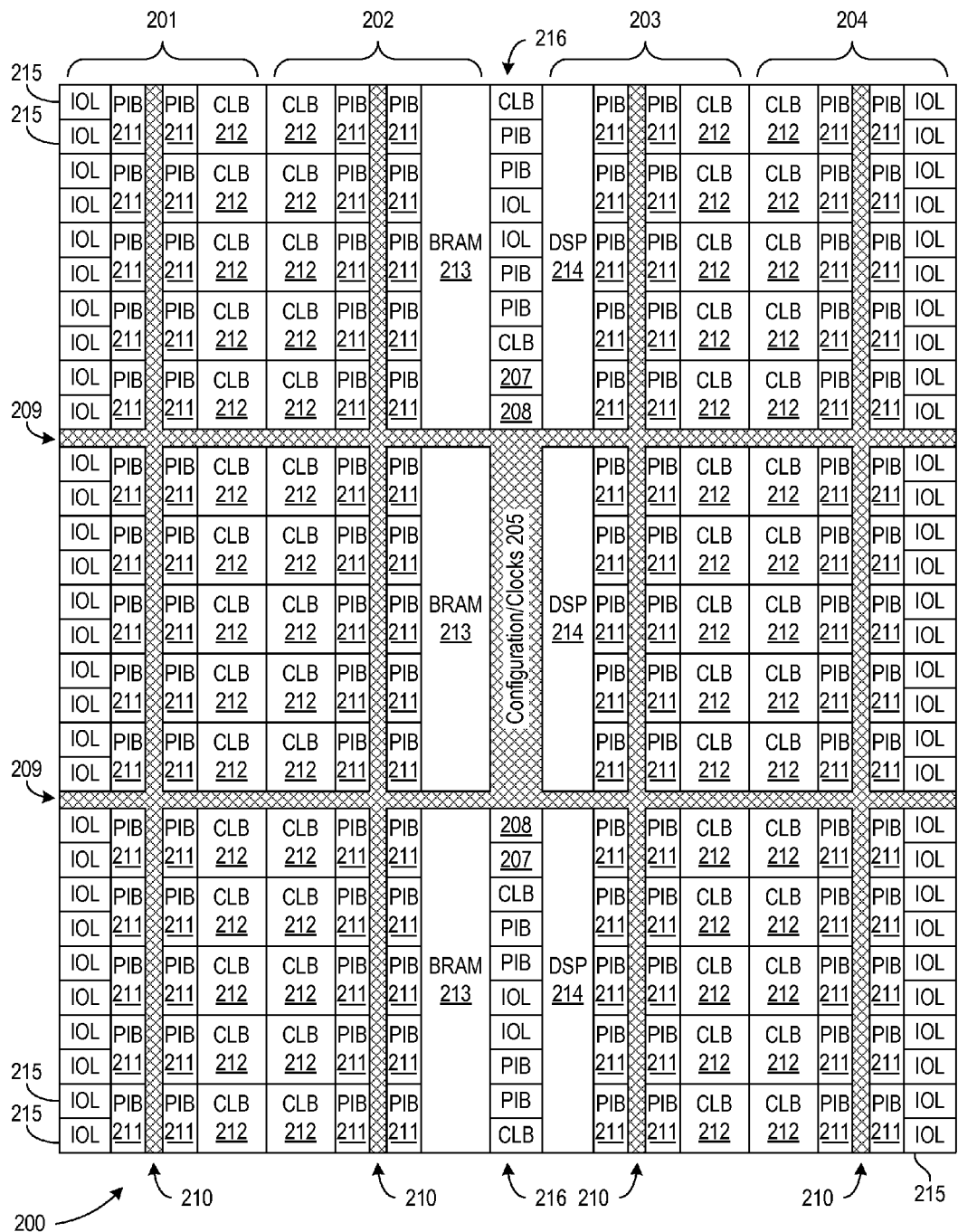
FIG. 2 is a layout diagram of a programmable logic device in accordance with various embodiments of the invention.

FIG. 2 is a layout diagram of a programmable logic device in accordance with various embodiments of the invention. The programmable logic device includes arrangements 201, 202, 203, and 204 of columns of programmable logic and interconnect blocks.

Advanced programmable logic devices, such as a field programmable gate array (FPGA), can include several different types of programmable tiles in the array. For example, FIG. 2 illustrates an FPGA architecture 200 having a large number of different programmable tiles that include configurable logic blocks (CLBs 212), random access memory (BRAMs 213), input/output logic blocks (IOLs 215), configuration and clock generation block 205, digital signal processing blocks (DSPs 214), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (not shown).

While many of the programmable tiles are positioned within the arrangements 201, 202, 203, and 204, the center of the die is not in any of the arrangements and includes programmable logic and interconnect blocks 206, which include configurable logic blocks, programmable interconnect blocks, and input/output logic blocks in the illustrated embodiment.

In some FPGAs, each programmable interconnect block (PIB 211) has standardized connections to and from nearby programmable interconnect blocks and possibly some remote programmable interconnect blocks. Therefore, the programmable interconnect blocks taken together implement the programmable interconnect structure for the illustrated FPGA. A programmable interconnect block (PIB 211) also includes connections to and from an abutting programmable logic block, such as CLB 212, a BRAM 213, an IOL 215, or a DSP 214.

A configurable logic element can include a programmable interconnect block (PIB 211) and the abutting configurable logic block (CLB 212) that can be programmed to implement user logic. A memory element can include a random access memory (BRAM 213) in addition to one or more programmable interconnect blocks. Typically, the number of these interconnect blocks for a programmable logic block depends on the height of the programmable logic block. In the pictured embodiment, CLB 212 has the same height as one programmable interconnect block (PIB 211), and BRAM 213 has the same height as five programmable interconnect blocks (PIBs 211), but other numbers (e.g., two, three, or four) can also be used. A digital signal processing element can include a DSP block (DSP 214) in addition to an appropriate number of abutting programmable interconnect blocks (PIBs 211). An input/output element can include, for example, two instances of an input/output logic block (IOL 215) abutting one instance of the programmable interconnect block (PIB 211).

The input/output logic blocks (IOLs 215) that are in arrangement 201 physically mirror those in arrangement 204. As will be clear to those of skill in the art, the actual I/O pads connected, for example, to each input/output logic block (IOL 215) typically are not confined to the area of that input/output logic block (IOL 215).

In the pictured embodiment, configuration and clock signals are generated and distributed throughout the die by the control logic area (shown cross-hatched in FIG. 2). Control generation block 205 near the center of the die generates configuration, clock, and other control signals. Horizontal areas 209 extending from control generation block 205 distribute these control signals across the breadth of the die. Columnar areas 210 distribute the clock and configuration signals vertically through the arrangements 201, 202, 203, and 204 of columns of programmable logic and interconnect blocks. Each of the arrangements 201, 202, 203, and 204 includes a shared columnar area 210 that abuts a column of programmable interconnect blocks (PIB 211) to the left and another column of programmable interconnect blocks (PIB 211) to the right. This shared columnar area distributes the configuration, clock, and other control signals to these programmable interconnect blocks for controlling these programmable interconnect blocks and for further distribution to the programmable logic blocks in the arrangement.

Note that FIG. 2 is intended to illustrate only an exemplary FPGA architecture. For example, the numbers of programmable logic or interconnect blocks in a column, the relative width of the columns, the number arrangements, the types of programmable logic or interconnect blocks included in the columns, and the relative sizes of the programmable logic and interconnect blocks are purely exemplary.

Figure 3:
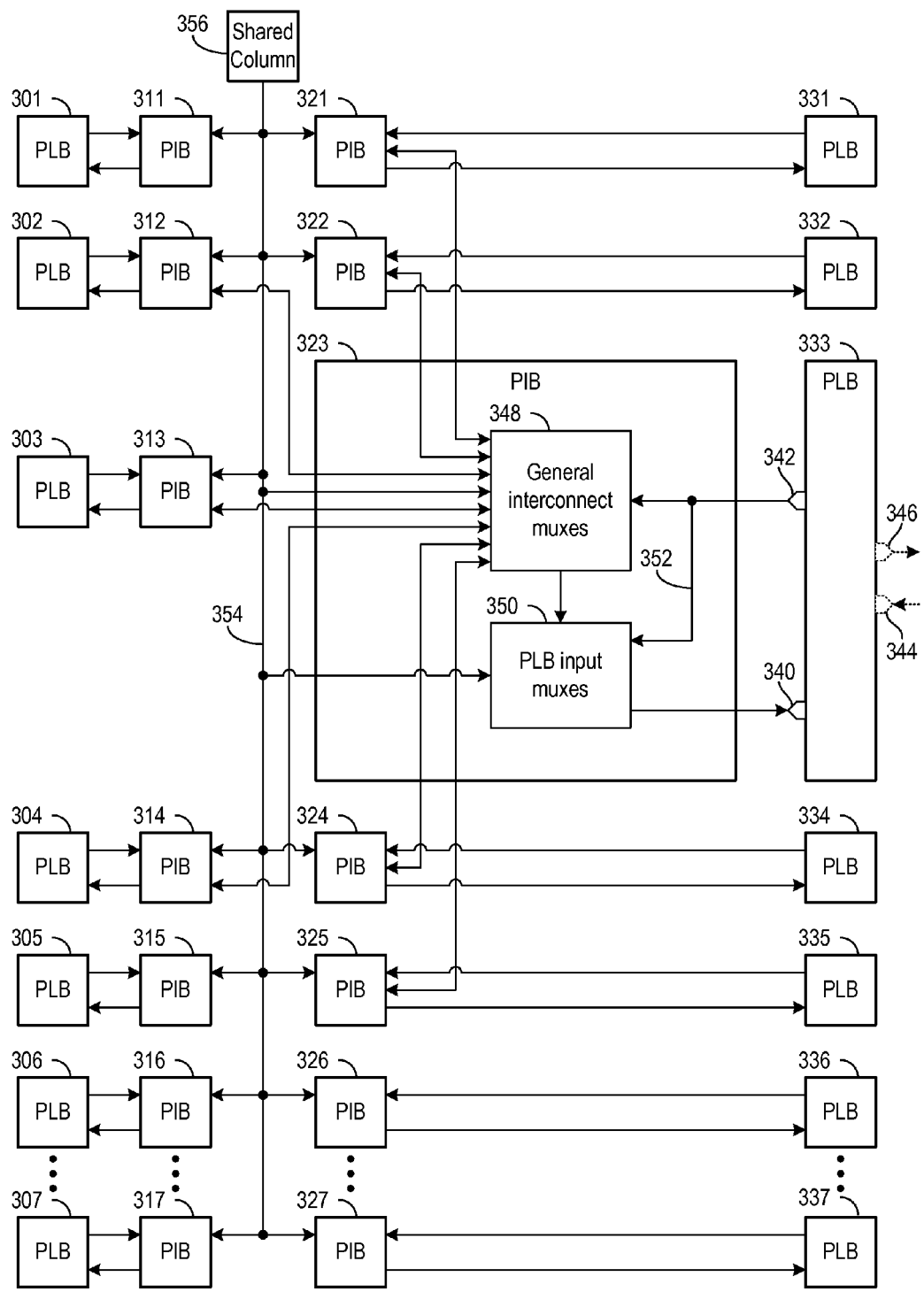
FIG. 3 is a block diagram illustrating an arrangement of programmable interconnect and logic blocks in accordance with various embodiments of the invention.

FIG. 3 is a block diagram illustrating an arrangement of programmable interconnect and logic blocks in accordance with various embodiments of the invention. The arrangement includes a column of programmable logic blocks 301, 302, 303, 304, 305, and 306 through 307; a column of programmable interconnect blocks 311, 312, 313, 314, 315, and 316 through 317; another column of programmable interconnect blocks 321, 322, 323, 324, 325, and 326 through 327; and another column of programmable logic blocks 331, 332, 333, 334, 335, and 336 through 337, with these columns included within the arrangement in the stated order from left to right.

Programmable interconnect block 323 and programmable logic block 333 are expanded to show details of their interconnections with each other and with programmable interconnect blocks 312, 313, 314, 321, 322, 324, and 325. It will be appreciated that the unexpanded programmable interconnect and logic blocks 301, 302, 303, 304, 305, 306 through 307, 311, 312, 313, 314, 315, 316 through 317, 321, 322, 324, 325, 326 through 327, 331, 332, 334, 335, and 336 through 337 have similar connections.

Programmable logic block 333 has an input port 340 and an output port 342. In certain embodiments, programmable logic block 333 may also have an optional input port 344 and an optional output port 346. Programmable logic block 333 generates the value of output port 342 (and optional output port 346) from the value of input port 340 (and optional input port 344). It will be appreciated that programmable logic block 333 can generate the value of output port 342 (and optional output port 346) from additional values, such as stored state within programmable logic block 333 and carry values from programmable logic blocks 332 or 334 for an adder implemented across the chain of programmable logic blocks 331, 332, 333, 334, 335, 336, and 337.

General interconnect multiplexers 348 of programmable interconnect block 323 selectively route the value or values from the output port 342 of the programmable logic block 333 to programmable interconnect blocks 312, 313, 314, 321, 322, 324, and 325, and programmable interconnect blocks 312, 313, 314, 321, 322, 324, and 325 selectively forward the values from the output port 342 to an input port of respective programmable logic blocks 302, 303, 304, 331, 332, 334, and 335. Correspondingly, programmable interconnect blocks 312, 313, 314, 321, 322, 324, and 325 selectively forward the values from an output port of respective programmable logic blocks 302, 303, 304, 331, 332, 334, and 335 to the programmable interconnect block 323 which selectively routes these values to the input port 340 via general interconnect multiplexers 348 and input multiplexers 350. Thus, the programmable interconnect blocks 311, 312, 313, 314, 315, 316 through 317, 321, 322, 323, 324, 325, and 326 through 327 selectively couple the output ports of programmable logic blocks 301, 302, 303, 304, 305, 306 through 307 and 331, 332, 333, 334, 335, 336 through 337 to certain input ports of these programmable logic blocks.

Input multiplexers 350 select the signal values routed to the input port 340 of programmable logic block 333. Input multiplexers 350 selectively couple the input port 340 to feedback on line 352 from the output port 342, or to signal lines 354 of the shared column 356, or to an output port of programmable logic blocks 302, 303, 304, 331, 332, 334, and 335 via general interconnect multiplexer 348 and programmable interconnect blocks 312, 313, 314, 321, 322, 324, and 325. The signal lines 354 from the shared column 356 include clock signals, reset signals, and other control signals. In one embodiment, shared column 356 corresponds to one of shared columns 210 of one of the arrangements shown in FIG. 2.

In one embodiment, the values of configuration memory cells control the routing of signals through multiplexers 348 and 350. Thus, the contents of configuration memory determine the interconnections between the shared column 356 and the input and output ports of the programmable logic blocks 301, 302, 303, 304, 305, 306 through 307, 331, 332, 333, 334, 335, and 336 through 337.

In one embodiment, programmable logic block 333 includes additional configuration memory cells that configure the operation of programmable logic block 333. In one example, programmable logic block 333 includes a configurable look-up table and a register with bypass. The configurable look-up table can implement any logic function of the values from input port 340 (and optional port 344). The register can be configured to drive the output port 342 (and optional port 346) directly with the result from the configurable look-up table or from the register storing the prior result from the configurable look-up table.

Thus, the programmable logic blocks 301, 302, 303, 304, 305, 306 through 307, and 331, 332, 333, 334, 335, and 336 through 337 can be configured to implement the logic and state machines of a user design, and the programmable interconnect blocks 311, 312, 313, 314, 315, 316 through 317, 321, 322, 323, 324, 325, and 326 through 327 can be configured to appropriately interconnect the logic and state machines of the user design.

In certain embodiments, programmable logic block 333 abuts another programmable logic block (not shown) in an adjacent arrangement. The programmable logic block 333 has input and output ports 340 and 342 on one side and the optional input and output ports 344 and 346 on an opposite side of programmable logic block 333. While ports 340 and 342 are coupled to the programmable interconnect block 323, the optional ports 344 and 346 are coupled to the abutting programmable logic block in the adjacent arrangement. The direct connection between programmable logic block 333 and the abutting programmable logic block in the adjacent arrangement permits fast communication between these two programmable logic blocks that bypasses any programmable interconnect blocks. While the programmable logic block 333 and the abutting programmable logic block in the adjacent arrangement are mirror images of each other in one embodiment, excluded from both mirror images are the crossover connection between optional output port 346 and a corresponding input port of the abutting programmable logic block and the connection between an output port of the abutting programmable logic block and the optional input port 344.

The present invention is thought to be applicable to a variety of programmable integrated circuit architectures. While the invention is illustrated using exemplary embodiments including programmable logic devices such as field programmable gate arrays, the invention is not so limited. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A programmable integrated circuit (IC), comprising:
a plurality of arrangements horizontally arranged in the programmable IC, each arrangement including a first logic column, an interconnect column, and a second logic column horizontally arranged in that order within the arrangement, wherein:
each interconnect column includes a plurality of programmable interconnect blocks vertically arranged in the interconnect column;
each of the first and second logic columns includes a plurality of programmable logic blocks vertically arranged in the logic column;
the plurality of programmable interconnect blocks in the interconnect column is equal in number to the plurality of programmable logic blocks in the first logic column;
each of the programmable interconnect blocks provides a plurality of first input and output ports at a first side of the programmable interconnect block and a plurality of second input and output ports at a second side of the programmable interconnect block;
each of the programmable logic blocks provides a plurality of third input and output ports on one side of the programmable logic block, the one side of each programmable logic block in the first logic column faces the one side of a corresponding programmable logic block in the second logic column and faces the first side of a corresponding one of the programmable interconnect blocks, and the one side of the corresponding programmable logic block in the second logic column faces the second side of the corresponding programmable interconnect block;
the first ports and the first side of each of the programmable interconnect blocks physically mirror the second ports and the second side of the programmable interconnect block;
the first ports of the programmable interconnect blocks in the interconnect column of each arrangement are coupled to the third ports of the programmable logic blocks in the first logic column of the arrangement; and
the second ports of the programmable interconnect blocks in the interconnect column of each arrangement are coupled to the third ports of the programmable logic blocks in the second logic column of the arrangement.

2. The programmable IC of claim 1, wherein each one of the programmable interconnect blocks in the interconnect column of the arrangements is coupled to at least four of the programmable interconnect blocks for selectively coupling the second input ports of the programmable logic blocks in the logic columns of the arrangements to the second output ports of the programmable logic blocks via the first output ports of the one of the programmable interconnect blocks and via the first input ports of the at least four of the programmable interconnect blocks.

3. The programmable IC of claim 1, wherein:
the first and second sides of each of the programmable interconnect blocks in the interconnect column of each of the arrangements are opposite ones of four sides of the programmable interconnect block; and
each of the programmable logic blocks in the first logic column of one of the arrangements physically mirrors each of the programmable logic blocks in the second logic column of one of the arrangements.

4. The programmable IC of claim 1, wherein:
the interconnect column of each of the arrangements includes a first interconnect sub-column and a second interconnect sub-column horizontally arranged in the order within the interconnect column;
the programmable interconnect blocks of the interconnect column include a first plurality of programmable interconnect sub-blocks vertically arranged in the first interconnect sub-column of the arrangement and a second plurality of programmable interconnect sub-blocks vertically arranged in the second interconnect sub-column of the arrangement;
the first ports of the programmable interconnect blocks are ports of the first programmable interconnect sub-blocks coupled to the third ports of the programmable logic blocks in the first logic column of the arrangement;
the second ports of the programmable interconnect blocks are ports of the second programmable interconnect sub-blocks coupled to the third ports of the programmable logic blocks in the second logic column of the arrangement; and
the ports and one of four sides of the first programmable interconnect sub-blocks physically mirror the ports and one of four sides of the second programmable interconnect sub-blocks.

5. A programmable integrated circuit (IC), comprising:
a plurality of arrangements horizontally arranged in the programmable IC, each arrangement including a first logic column, a first interconnect column, a second interconnect column, and a second logic column horizontally arranged in that order within the arrangement, wherein:
each of the first and second interconnect columns includes a plurality of programmable interconnect blocks vertically arranged in the interconnect column;
each of the first and second logic columns includes a plurality of programmable logic blocks vertically arranged in the logic column;
each of the programmable interconnect blocks provides a plurality of first input and output ports at one side of the programmable interconnect block;
each of the programmable logic blocks provides a plurality of second input and output ports at one side of the programmable logic block;
the first ports and the one side of each of the programmable interconnect blocks in the first interconnect column of each arrangement physically mirror the first ports and the one side of each programmable interconnect block in the second interconnect column of the arrangement;

the one side of each programmable logic block in the first logic column faces the one side of a corresponding programmable logic block in the second logic column and faces the one side of a corresponding one of the programmable interconnect blocks in the first interconnect column, and the one side of the corresponding programmable logic block in the second logic column faces the one side of a corresponding one of the programmable interconnect blocks in the second interconnect column;

the first ports of the programmable interconnect blocks in the first interconnect column of each arrangement are coupled to the second ports of the programmable logic blocks in the first logic column of the arrangement; and the first ports of the programmable interconnect blocks in the second interconnect column of each arrangement are coupled to the second ports of the programmable logic blocks in the second logic column of the arrangement.

6. The programmable IC of claim 5, wherein each one of the programmable interconnect blocks in the interconnect columns of the arrangements is coupled to at least four of the programmable interconnect blocks for selectively coupling the second input ports of the programmable logic blocks in the logic columns of the arrangements to the second output ports of the programmable logic blocks via the first output ports of the one of the programmable interconnect blocks and via the first input ports of the at least four of the programmable interconnect blocks.

7. The programmable IC of claim 6, wherein:

each arrangement includes the first logic column, the first interconnect column, the second interconnect column, and the second logic column horizontally arranged from left to right in that order within the arrangement;

the one side of the programmable logic blocks is a right side for the programmable logic blocks in each first logic column and a left side for the programmable logic blocks in each second logic column; and the one side of the programmable interconnect blocks is a left side for the programmable interconnect blocks in each first interconnect column and a right side for the programmable interconnect blocks in each second interconnect column.

8. The programmable IC of claim 7, wherein;

the right side of the programmable logic blocks in the first logic column of each arrangement abuts the left side of the programmable interconnect blocks in the first interconnect column of the arrangement; and the right side of the programmable interconnect blocks in the second interconnect column of each arrangement abuts the left side of the programmable logic blocks in the second logic column of the arrangement.

9. The programmable IC of claim 8, wherein:

each of the programmable interconnect blocks in the first interconnect column of each arrangement functionally mirrors each of the programmable interconnect blocks in the second interconnect column of each arrangement;

the programmable logic blocks in each logic column of each arrangement have a same one of a plurality of types; and for each of the types, each of the programmable logic blocks having the type in the first logic column of each arrangement physically mirrors each of the programmable logic blocks having the type in the second logic column of each arrangement.

10. The programmable IC of claim 9, wherein:

each of the arrangements further includes a shared column horizontally arranged between and abutting the first interconnect column and the second interconnect column; and each of the programmable interconnect blocks in the first and second interconnect columns selectively couples each of a plurality of clock and control lines of the shared column to at least one of the second input ports to which the first output ports of the programmable interconnect block are coupled.

11. The programmable IC of claim 10, wherein, for the second logic column of a first one of the arrangements that is adjacent in the programmable IC to the first logic column of a second one of the arrangements:

each programmable logic block in the second and first logic columns has a plurality of third ports at another side opposite the one side of the programmable logic block; and the programmable logic blocks in the second and first logic columns are coupled via the third ports.

12. The programmable IC of claim 5, wherein:

the one side of the programmable logic blocks in the first logic column of each arrangement abuts the one side of the programmable interconnect blocks in the first interconnect column of the arrangement; and the one side of the programmable logic blocks in the second logic column of each arrangement abuts the one side of the programmable interconnect blocks in the second interconnect column of the arrangement.

13. The programmable IC of claim 5, wherein the programmable logic blocks in each logic column of each arrangement have a same one of a plurality of types.

14. The programmable IC of claim 13, wherein:

a first plurality of groups of the programmable logic blocks in the first logic column of each arrangement corresponds to a second plurality of groups of the programmable interconnect blocks in the first interconnect column of the arrangement;

a third plurality of groups of the programmable logic blocks in the second logic column corresponds to a fourth plurality of groups of the programmable interconnect blocks in the second interconnect column of the arrangement;

for a first number of the programmable logic blocks in each of the first groups and a second number the programmable interconnect blocks in each of the second groups, the first and second numbers respectively are two and one, one and one, one and two, one and three, one and four, or one and five; and for a third number of the programmable logic blocks in each of the third groups and a fourth number the programmable interconnect blocks in each of the fourth groups, the third and fourth numbers respectively are two and one, one and one, one and two, one and three, one and four, or one and five.

15. The programmable IC of claim 13, wherein, for each of the types, each of the programmable logic blocks that have the type and are in the first logic column of the arrangements physically mirrors each of the programmable logic blocks that have the type and are in the second logic column of the arrangements.

16. The programmable IC of claim 5, wherein each of the programmable logic blocks in the first logic column of one of the arrangements physically mirrors each of the programmable logic blocks in the second logic column of one of the arrangements.

17. The programmable IC of claim 5, wherein:
each of the second input ports of each programmable logic block in the first logic column of each arrangement is selectively coupled to at least one of the second output ports of at least three of the programmable logic blocks in the second logic column of the arrangement; and
the second input port is selectively coupled to the at least one second output port of the at least three programmable logic blocks entirely within an area of the interconnect columns of the arrangement and without entering an area of the logic columns of the arrangement.

18. The programmable IC of claim 5, wherein:
each of the arrangements further includes a shared column horizontally arranged between and abutting the first interconnect column and the second interconnect column; and
each of the programmable interconnect blocks in the first and second interconnect columns selectively couples each of a plurality of signal lines of the shared column to at least one of the second input ports to which the first output ports of the programmable interconnect block are coupled.

19. The programmable IC of claim 5, wherein, for the second logic column of a first one of the arrangements that is adjacent in the programmable IC to the first logic column of a second one of the arrangements:
each programmable logic block in the second and first logic columns has a plurality of third ports at another side opposite the one side of the programmable logic block; and
the programmable logic blocks in the second and first logic columns are coupled via the third ports.

20. A programmable integrated circuit (IC), comprising:
a plurality of programmable interconnect blocks vertically arranged in each of a plurality of first interconnect columns and each of a plurality of second interconnect columns, each of the programmable interconnect blocks providing a plurality of first input and output ports at one of four sides of the programmable interconnect block; and
a plurality of programmable logic blocks vertically arranged in each of a plurality of first logic columns and each of a plurality of second logic columns, each of the programmable logic blocks providing a plurality of second input and output ports at one of four sides of the programmable logic block, wherein:

the first and second logic columns and the first and second interconnect columns are horizontally arranged in a plurality of arrangements of the programmable IC, each arrangement including one of the first logic columns;
one of the first interconnect columns, one of the second interconnect columns, and one of the second logic columns are horizontally arranged in that order within the arrangement;
the first ports and the one side of each of the programmable interconnect blocks in the first interconnect column of each arrangement physically mirror the first ports and the one side of each of programmable interconnect blocks in the second interconnect column of the arrangement;
within each arrangement, the one side of each programmable logic block in the first logic column faces the one side of a corresponding programmable logic block in the second logic column and faces the one side of a corresponding one of the programmable interconnect blocks in the first interconnect column, and the one side of the corresponding programmable logic block in the second logic column faces the one side of a corresponding one of the programmable interconnect blocks in the second interconnect column;
the first ports of the programmable interconnect blocks in the first interconnect column of each arrangement are coupled to the second ports of the programmable logic blocks in the first logic column of the arrangement;
the first ports of the programmable interconnect blocks in the second interconnect column of each arrangement are coupled to the second ports of the programmable logic blocks in the second logic column of the arrangement; and
each one of the programmable interconnect blocks in the interconnect columns of the arrangements is coupled to at least four of the programmable interconnect blocks for selectively coupling the second input ports of the programmable logic blocks in the logic columns of the arrangements to the second output ports of the programmable logic blocks via the first output ports of the one of the programmable interconnect blocks and via the first input ports of the at least four of the programmable interconnect blocks.

* * * * *